United States Patent [19]
Roohparvar

[11] Patent Number: 5,627,786
[45] Date of Patent: May 6, 1997

[54] PARALLEL PROCESSING REDUNDANCY SCHEME FOR FASTER ACCESS TIMES AND LOWER DIE AREA

[75] Inventor: Frankie F. Roohparvar, Cupertino, Calif.

[73] Assignee: Micron Quantum Devices, Inc., Santa Clara, Calif.

[21] Appl. No.: 387,018

[22] Filed: Feb. 10, 1995

[51] Int. Cl.$^6$ .................................................. G11C 29/00
[52] U.S. Cl. ............................................ 365/200; 371/10.3
[58] Field of Search .................... 395/182.04, 182.05, 395/182.06; 365/200; 371/10.3

[56] References Cited

U.S. PATENT DOCUMENTS

| | | | |
|---|---|---|---|
| 4,250,570 | 2/1981 | Tsang et al. | 365/200 |
| 4,389,715 | 6/1983 | Eaton, Jr. et al. | 365/200 |
| 4,459,685 | 7/1984 | Sud et al. | 365/200 |
| 4,807,191 | 2/1989 | Flannagan | 365/200 |
| 4,881,200 | 11/1989 | Urai | 365/189.04 |
| 4,885,720 | 12/1989 | Miller et al. | 365/200 |
| 5,163,023 | 11/1992 | Ferris et al. | 365/200 |
| 5,265,054 | 11/1993 | McClure | 365/200 |
| 5,287,310 | 2/1994 | Schreck et al. | 365/189.05 |
| 5,343,439 | 8/1994 | Hoshino | 365/200 X |

FOREIGN PATENT DOCUMENTS

| | | |
|---|---|---|
| 0554053 | 8/1993 | European Pat. Off. . |
| 0559368 | 9/1993 | European Pat. Off. . |
| 2611301 | 8/1988 | France . |
| 4241327 | 6/1993 | Germany . |

*Primary Examiner*—Son T. Dinh
*Attorney, Agent, or Firm*—Schwegman, Lundberg, Woessner & Kluth, P.A.

[57] ABSTRACT

A parallel processing redundancy memory circuit. The circuit includes parallel data paths for regular memory columns and redundant columns. An input/output buffer is coupled to the parallel paths and receives I/O selection bits. In operation, address drivers simultaneously access both the regular memory and the redundant columns. The input/output buffer then selects the appropriate data path, as determined by the I/O selection bits, for writing or reading data.

42 Claims, 4 Drawing Sheets

PARALLEL PROCESSING REDUNDANCY SCHEME FOR FASTER ACCESS TIMES AND LOWER DIE AREA

FIELD OF THE INVENTION

The present invention relates generally to semiconductor circuits and packaged integrated circuits, such as memory chips, data registers and the like. More particularly, the present invention relates to memory circuits, such as flash EPROMs, which use redundant storage elements.

BACKGROUND OF THE INVENTION

Redundancy and its implementation has been one of the more significant challenges in memory chips. In many applications, the effects of a redundancy implementation on the die area as well as the access time are important aspects of a memory, especially in larger and more dense memory chips.

In some redundancy approaches, the addresses are received and compared in parallel with selection of the decoders. Typically, if it is determined that the address is a repaired location, then the redundancy circuit is engaged. The redundancy circuit sends a signal to the regular decoder to disengage or deselect the regular array, and then select the redundant element. Detection of a match on the incoming address for a redundant element usually takes approximately 5 to 10 nanoseconds, during which time the decoders start selecting the proper memory elements. On very high density parts, the decoder lines have tens of picofarad capacitive load and thus require very large drivers. As such, the deselect signal is usually not near the last stages of the decoder due to the area consumed by the large number of decoder drivers.

With such large capacitive loads, the last stage requires approximately 5 nanoseconds to select and deselect. After the 5 to 10 nanoseconds of delay for matching detection circuit, the redundancy circuit will send a signal to instruct the regular decoders to deselect. Because the deselection stage is not the last stage of the decoder, it will take additional time for the regular decoder to turn off. If a redundant element is accessed, it will be generally slower than the actual element by approximately 10 to 20 nanoseconds. This accounts for a significant speed loss. With very large density memories, 50% to 80% of the dies that pass have some redundant elements.

Another feature that is used in some redundant schemes is the replacement of the entire byte (or word) if a bit is found to be defective within that word. If eight redundant columns were to be replaceable, one must design 64 columns in the array. On a four-megabit flash circuit, for example, this amounts to approximately five mils more on one dimension of the chip, which translates to many thousands of mils of additional square area.

Accordingly, there is a need for a memory circuit with a redundancy scheme that improves upon die area and access speed.

SUMMARY OF THE INVENTION

Generally, the present invention provides an improved redundancy scheme within a memory array by using a parallel path for redundant elements of a memory array. In one embodiment, the present invention comprises: a memory having a preselected number of rows and columns, and one or more redundant storage elements, each having addresses associated therewith; address lines coupled to transmit address signals to the rows and columns and to the one or more redundant storage elements; a first data bus coupled to the columns; a redundant data bus coupled to the one or more redundant storage elements; and an access buffer having a first input coupled to the first data bus, a second input coupled to the redundant data bus, a control terminal coupled to receive a signal, and an output, the access buffer selectively coupling the first data bus or the redundant data bus to the output as determined by the signal.

In yet another embodiment, the present invention comprises a method for parallel processing redundancy in a memory which includes a preselected number of rows and columns, and one or more redundant storage elements, each having addresses associated therewith; address lines coupled to transmit address signals to the rows and columns and to the one or more redundant storage elements, the method comprising the steps of: receiving a signal; simultaneously receiving first data from a first data bus coupled to the rows and columns, and receiving second data from a second data bus coupled to the redundant storage elements; and selecting data either from the first data bus or from the second data bus, as determined by the signal.

The above summary of the present invention is not intended to present each embodiment or every aspect of the present invention. This is the purpose of the figures and the associated description which follow.

BRIEF DESCRIPTION OF THE DRAWINGS

Other aspects and advantages of the present invention will become apparent upon reading the following detailed description and upon reference to the drawings in which.

Figure 1:
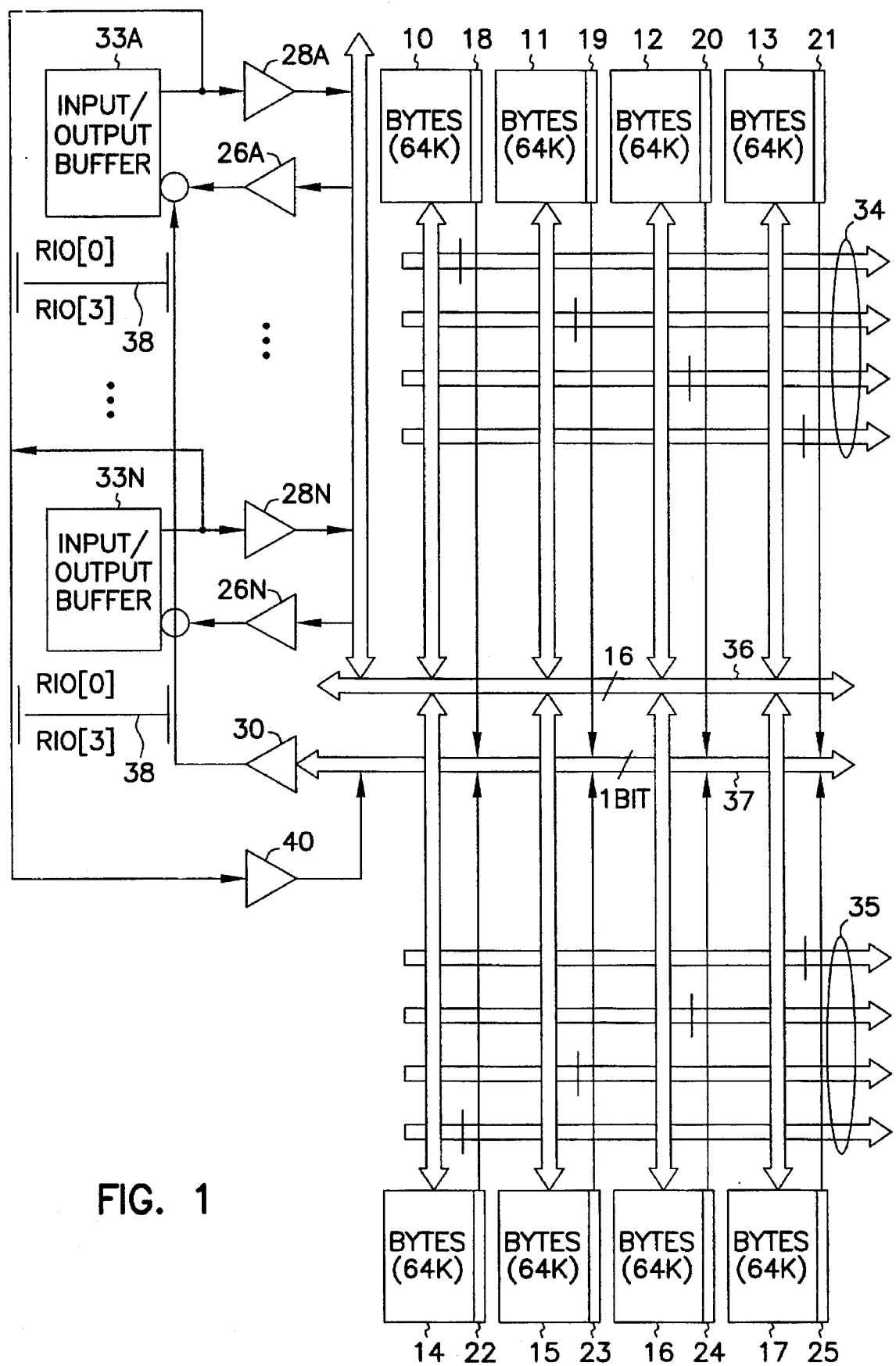
FIG. 1 is a block diagram of a memory architecture in accordance with the principles of the present invention.

While the invention is susceptible to various modifications and alternative forms, specifics thereof have been shown by way of example in the drawing and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION OF THE DRAWINGS

The present invention has a wide variety of applications in memory circuits. It provides for a memory architecture with parallel redundancy in order to eliminate the delay caused by selecting a defective column and subsequently deselecting the column. The present invention instead accesses in parallel a memory column and a corresponding redundant memory column, and then determines at an input/output buffer from which column to select the data. The present invention is particularly useful with memories that use floating gate transistors, and in particular with, for example, flash EPROMs, EEPROMs, SRAMs, and DRAMs.

In addition, the present invention preferably replaces a defective memory column with a redundant column, instead of replacing an entire byte, as is found in some redundancy schemes. This is achieved by adding four bits, for example, to the address field in order to specify which one of sixteen columns is defective so that only the specified column is replaced. Replacing only one column, as opposed to an entire byte, also results in a savings in terms of die area by significantly reducing the amount of required die area.

FIG. 1 is a block diagram of an exemplary circuit for implementing the present invention. The circuit typically includes a plurality of upper memory storage elements 10–13 and associated redundant columns 18–21, and lower memory storage elements 14–17 and associated redundant columns 22–25. As is known in the art, the redundant columns are used to replace defective columns within the memory array.

A plurality of upper select lines 34 are associated with a decoder (not shown) for decoding addresses and selecting particular memory rows and columns, and redundant columns, in the upper part of the memory array. A plurality of lower select lines 35 are associated with a decoder (not shown) for decoding addresses and selecting particular memory rows and columns, and redundant columns, in the lower part of the memory array. Memory address decoding and selection is known in the art.

The columns within blocks 10–17 are coupled to a data bus 36 for use in writing data to and reading data from the memory. The data bus 36 is coupled to sense amplifiers 26A–26N (one sense amplifier per line), which operate in a conventional manner to receive and amplify data signals from the memory. The sense amplifiers 26A–26N are coupled to input/output buffers 33A–33N (one input/output buffer per line). Input drivers 28A–28N (one driver per line) are coupled to the data bus 36 and the input/output buffers 33A–33N, and operate in a conventional manner in order to receive data and write the data to memory storage elements in the columns within blocks 10–17.

The redundant columns 18–25 are coupled to a redundant data bus 37 for use in writing data to and reading data from the redundant columns. The data bus 37 is coupled to a redundant sense amplifier 30, which operates in a conventional manner to receive and amplify data signals from the redundant columns 18–25. A redundant input drivers 40 is coupled to the redundant data bus 37 and the input/output buffers 33A–33N, and operates in a conventional manner in order to receive data in buffers 33A–33N, and write the data to memory storage elements within the redundant columns 18–25.

Figure 2:
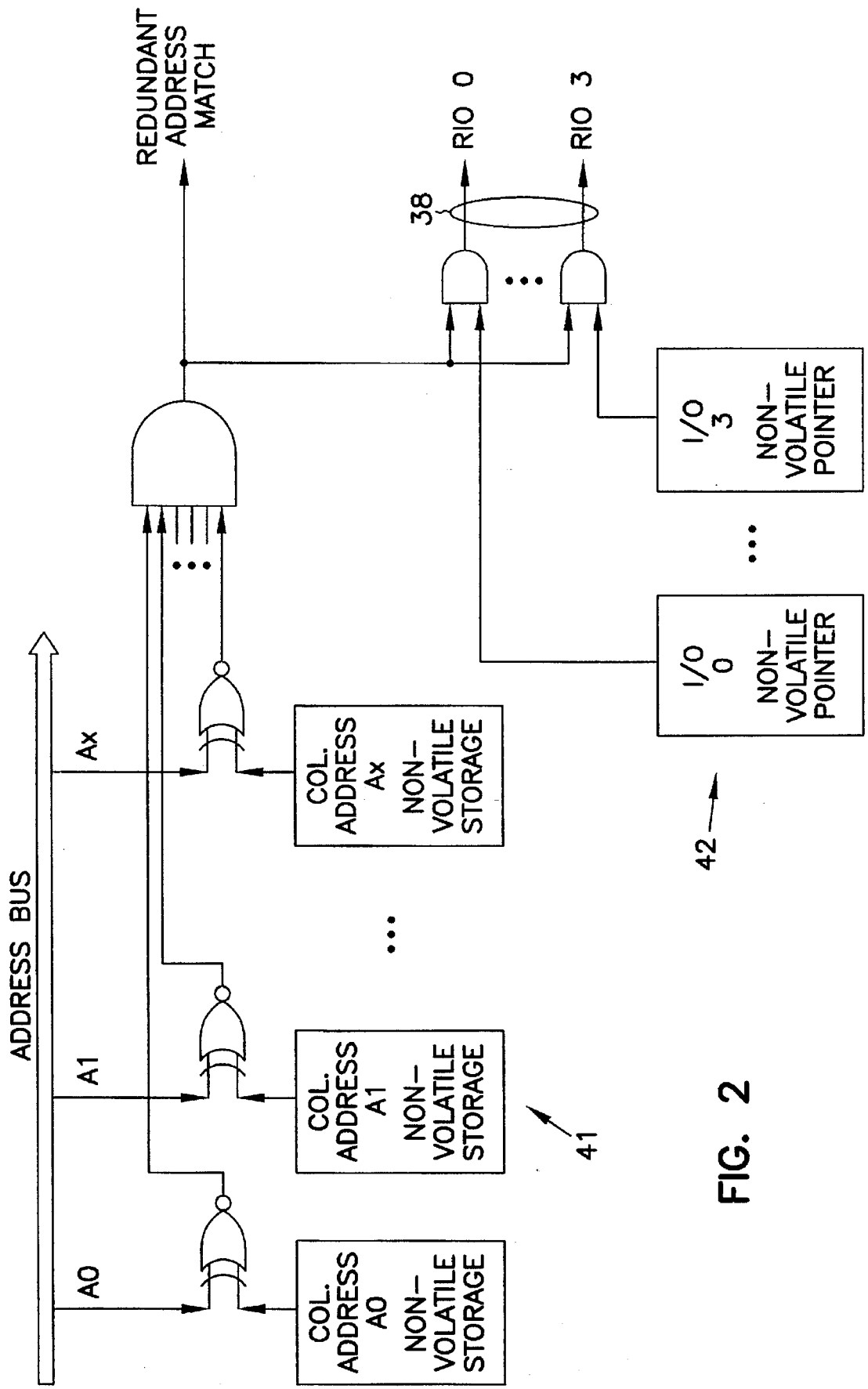
FIG. 2 is a block diagram of circuitry for generating redundant I/O selection signals.
Figure 3:
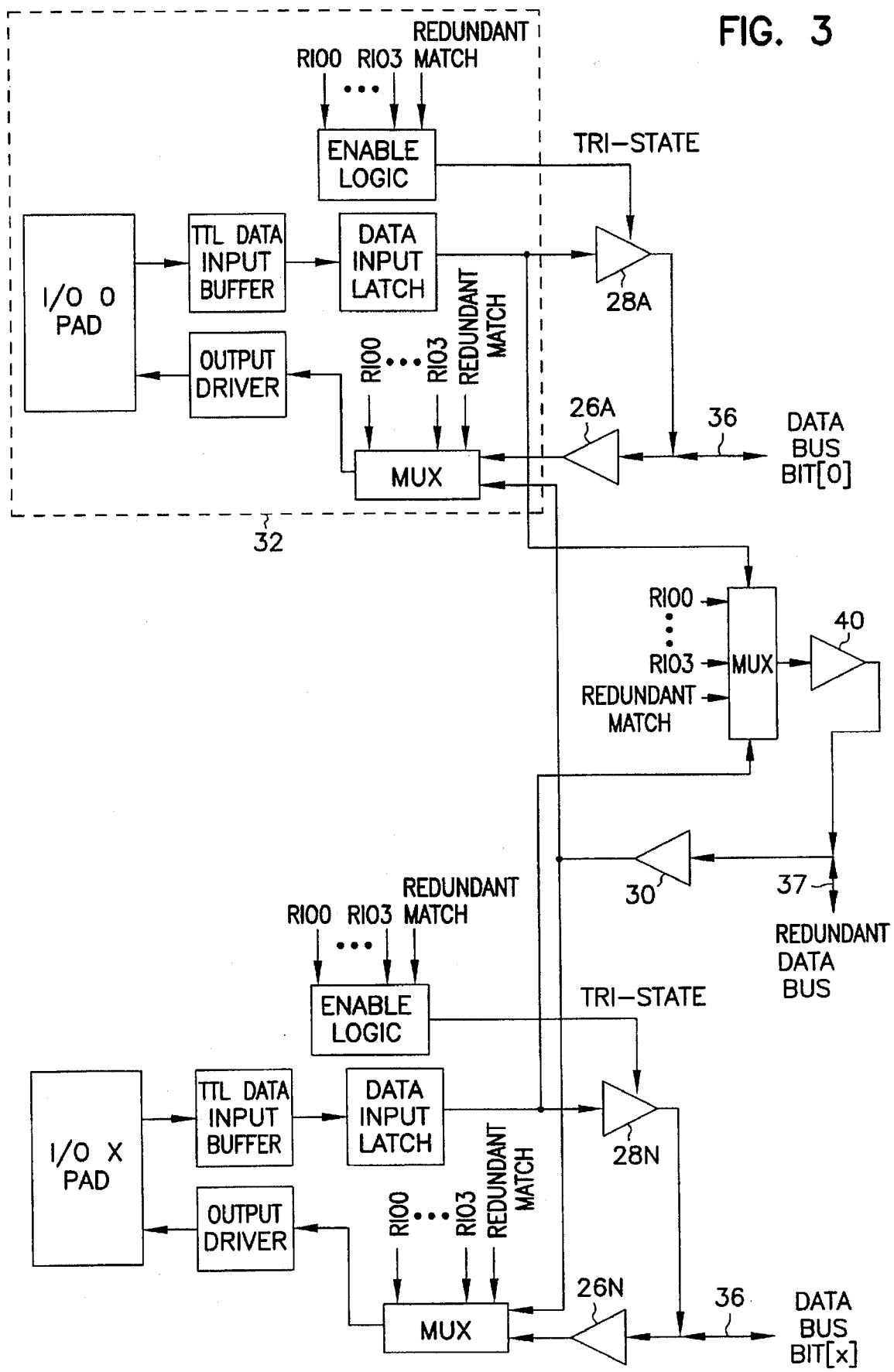
FIG. 3 is a more detailed block diagram of input/output circuitry for interfacing with the memory architecture shown in FIG. 1.

The input/output buffers 33A–33N operate as multiplexers. Redundant I/O (RIO) selection lines 38 transmit I/O selection bits to control terminals of the input/output buffers 33A–33N so that the buffers selectively couple the data bus 36 and redundant data bus 37 to output terminals depending upon the content of the I/O selection bits. FIG. 2 is a block diagram of circuitry for generating the redundant I/O selection signals. In FIG. 2, circuitry 41 generates address signals for columns within the memory, and circuitry 42 generates signals specifying defective columns. For example, with a sixteen-bit wide field, circuitry 42 requires four bits stored within the nonvolatile pointers in order to specify which one of the sixteen columns within a particular field is defective. FIG. 3 is a more detailed block diagram of circuitry for interfacing the memory.

In a read operation, address comparator circuitry which generates the I/O bits evaluates whether a redundant column must be used. This evaluation typically requires approximately 5 to 10 nanoseconds. At the same time, the decoding and selection circuitry has selected the appropriate column in the regular memory columns within blocks 10–17. If the comparator circuitry determines that one of the redundant columns 18–25 must be used in place of a regular memory column, the circuit typically does not disable the regular decoders. The decoder for the regular memory columns within blocks 10–17 is typically still needed, since seven out of eight columns will use that decoder.

Therefore, the regular memory columns within blocks 10–17 execute a read operation through the sense amplifiers 26A–26N, and the redundant columns 18–25 execute a read operation through the redundant sense amplifier 30. At the same time that the address comparator was evaluating whether a redundant address matches the incoming address, the redundant I/O identifier bits map which one of the I/Os is defective. With the present invention, it is only after the sense amplifiers 26A–26N and 30 that the circuit uses the information of whether there is a redundant element selected. At that time, if a redundant element is selected, the input/output buffers 33A–33N will select the result of the redundant sense amplifier 30 instead of the sense amplifiers 26A–26N. Accordingly, an advantage of the present invention is that it eliminates the delay resulting from the deselection of the regular path and subsequent selection of the redundant path, as is found in some redundant memory scheme.

The present invention improves upon access time. Since the amount of the time it takes for the reading to be completed is usually 80% of the access time, and since the comparison of the address and the I/O bit field occurs in parallel, there will not be any access time penalty as a result of the comparison delay. The only additional delay is a multiplexing of the data at the output of the sense amplifiers, which is equivalent to one gate delay. That delay is usually less than a nanosecond. Most complex chips require a multiplexer at the output of the sense amplifier in order to transmit, for example, electronic identifier codes and internal status codes. As a result, the delay resulting from the multiplexer is typically already included in the access time.

For writing the data, the same procedure is repeated but in the opposite direction. The write data is usually stored in a latch. It is typically a considerable amount of time later that the circuit determines whether the data is to be routed to a regular or a redundant column. The delay for address matching is thus not a factor. If one of the redundant columns is to be used, as determined from the I/O bits, the circuit then selects from the input/output buffers 33A–33N the redundant data that is used by the input driver 40.

The circuit preferably disables a regular driver for a defective column when writing to the defective column using a redundant driver. This improves circuit performance. If a regular driver for a defective column were selected, it is possible that the driver would draw a lot of current due to a short, causing it to "pull down" the program voltage source. Since all other drivers are also coupled to the program voltage source, this would cause those bits to receive a decreased level of the program voltage source, which could disturb the write operation of those bits. By disabling the regular driver to the defective column, the circuit avoids this undesirable situation.

Otherwise, if a redundant column is not to be used, the circuit selects with the input/output buffers 33A–33N the data input drivers 28A–28N.

In summary, the present invention significantly improves access time by using parallel paths to redundant memory elements. It also saves chip area by only replacing a defective column with one redundant column instead of replacing an entire byte (eight columns) or word (16 columns).

Figure 4:
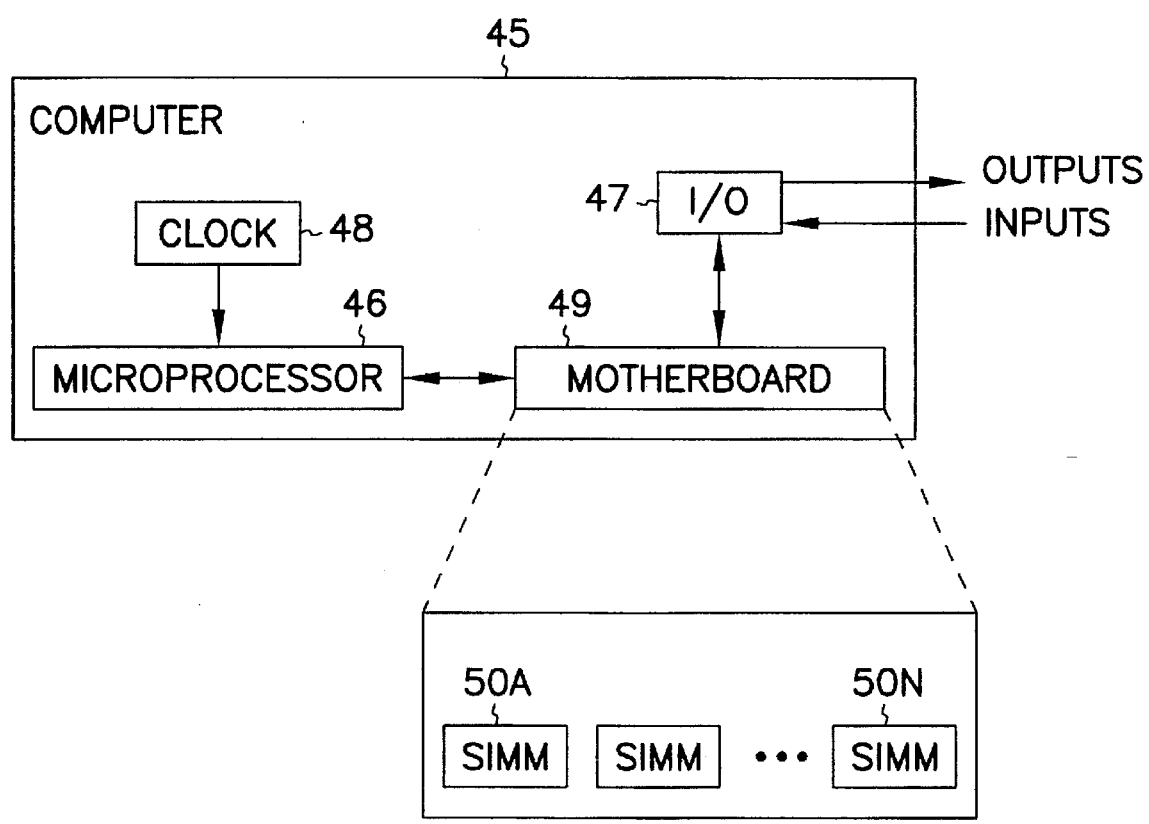
FIG. 4 is a block diagram of an exemplary computer that may incorporate the present invention.

FIG. 4 is a block diagram of an exemplary computer 45 that may incorporate the present invention. The computer 45 includes a microprocessor 46 and corresponding clock 48. The microprocessor 46 contains the central processing unit (CPU) and associated control circuitry. The microprocessor 46 is connected to a motherboard 49. An I/O interface module 47 is connected to the motherboard 49 and interfaces the microprocessor 46 with peripheral devices such as a monitor and printer. The motherboard 49 also contains a plurality of memory modules for storing data, such as single in-line memory modules (SIMMs) 50A–50N. The motherboard 49 is typically implemented with a printed circuit board, and the SIMMs 50A–50N are typically implemented with integrated circuit chips which "plug into" the motherboard 49. A nonvolatile memory is usually used on the motherboard 49, SIMMs 50A–50N, or through the I/O interface module 47.

The foregoing description, which has been disclosed by way of the above examples and discussion, addresses preferred embodiments of the present invention encompassing the principles of the present invention. The embodiments may be changed, modified and/or implemented using various circuit types and arrangements. Those skilled in the art will readily recognize that these and various other modifications and changes may be made to the present invention without strictly following the exemplary embodiments and applications illustrated and described herein, without departing from the true spirit and scope of the present invention which is set forth in the following claims.

What is claimed is:

1. A memory circuit with parallel processing redundancy, comprising:

a memory having multiple memory arrays, each memory array having rows and columns of non-redundant storage elements, one or more columns of redundant storage elements, and addresses associated therewith;

address lines coupled to transmit access signals to the rows and columns and to the one or more redundant storage elements;

a first data bus coupled to the columns of non-redundant storage elements in each of the memory arrays;

a redundant data bus coupled to the one or more redundant storage elements in each of the memory arrays; and an access buffer having a first input coupled to the first data bus, a second input coupled to the redundant data bus, a control terminal coupled to receive a signal, and an output, the access buffer selectively coupling the first data bus or the redundant data bus to the output as determined by the signal.

2. The memory circuit of claim 1 wherein the access buffer comprises a plurality of access buffers, each of the plurality of access buffers receiving one bit of data from the first data bus and one bit of data from the redundant data bus.

3. The memory circuit of claim 1, further comprising circuitry for generating the signal, comprising:

a first circuit for generating a first signal identifying a plurality of columns within the memory; and a second circuit for generating a second signal identifying a defective column within the plurality of columns.

4. The memory circuit of claim 1, further comprising:

a first plurality of sense amplifiers coupled between the first data bus and the access buffer; and a redundant sense amplifier coupled between the redundant data bus and the access buffer.

5. The memory circuit of claim 1, further comprising a plurality of sense amplifiers coupled to an input of the access buffer.

6. The memory circuit of claim 1, further comprising:

a plurality of first data input drivers coupled between the access buffer and the first data bus, each of the plurality of first data input drivers transmitting at least one bit of data to the first data bus; and a redundant data input driver coupled between the access buffer and the redundant data bus, the access buffer selectively coupling the first data input drivers to the first data bus or the redundant data input driver to the redundant data bus as determined by the signal.

7. The memory circuit of claim 6, further comprising a circuit for disabling one of the plurality of first data input drivers if the one driver is coupled to transmit a bit of the data to a defective column within the columns.

8. The memory circuit of claim 1 wherein the memory is configured to store eight-bit bytes.

9. The memory circuit of claim 1 wherein the memory is implemented with floating gate transistors.

10. The memory circuit of claim 1 wherein the memory is a flash EPROM.

11. The memory circuit of claim 1 wherein the memory is an EEPROM.

12. The memory circuit of claim 1 wherein the memory is an SRAM.

13. The memory circuit of claim 1 wherein the memory is a DRAM.

14. A computer, comprising:

a processor;

a clock circuit connected to the processor;

a module, connected to the processor, for interfacing the processor with peripheral devices; and a memory circuit connected to the processor, comprising:

a memory having multiple memory arrays, each memory array having rows and columns of non-redundant storage elements, one or more columns of redundant storage elements, and addresses associated therewith;

address lines coupled to transmit address signals to the rows and columns and to the one or more redundant storage elements;

a first data bus coupled to the columns of non-redundant storage elements in each of the memory arrays;

a redundant data bus coupled to the one or more redundant storage elements in each of the memory arrays; and an access buffer having a first input coupled to the first data bus, a second input coupled to the redundant data bus, a control terminal coupled to receive a signal, and an output, the access buffer selectively coupling the first data bus or the redundant data bus to the output as determined by the signal.

15. The computer of claim 14 wherein the access buffer comprises a plurality of access buffers, each of the plurality of access buffers receiving one bit of data from the first data bus and one bit of data from the redundant data bus.

16. The computer of claim 14, further comprising circuitry for generating the signal, comprising:

a first circuit for generating a first signal identifying a plurality of columns within the memory; and a second circuit for generating a second signal identifying a defective column within the plurality of columns.

17. The computer of claim 14, further comprising:

a first plurality of sense amplifiers coupled between the first data bus and the access buffer; and a redundant sense amplifier coupled between the redundant data bus and the access buffer.

18. The computer of claim 14, further comprising a plurality of sense amplifiers coupled to an input of the access buffer.

19. The computer of claim 14, further comprising:

a plurality of first data input drivers coupled between the access buffer and the first data bus, each of the plurality of first data input drivers transmitting at least one bit of data to the first data bus; and a redundant data input driver coupled between the access buffer and the redundant data bus, the access buffer selectively coupling the first data input drivers to the first data bus or the redundant data input driver to the redundant data bus as determined by the signal.

20. The computer of claim 19, further comprising a circuit for disabling one of the plurality of first data input drivers if the one driver is coupled to transmit a bit of the data to a defective column within the columns.

21. The computer of claim 14 wherein the memory is configured to store eight-bit bytes.

22. The computer of claim 14 wherein the memory is implemented with floating gate transistors.

23. The computer of claim 14 wherein the memory is a flash EPROM.

24. The computer of claim 14 wherein the memory is an EEPROM.

25. The computer of claim 14 wherein the memory is an SRAM.

26. The computer of claim 14 wherein the memory is a DRAM.

27. The computer of claim 14 wherein the memory is contained within an integrated circuit package.

28. The computer of claim 27, further comprising a motherboard connected to the processor, and wherein the integrated circuit package containing the memory is connected to the motherboard.

29. A method of parallel processing redundancy in a memory which includes multiple memory arrays, each memory array having a preselected number of rows and columns of nonredundant storage elements, one or more columns of redundant storage elements, and addresses associated therewith, address lines coupled to transmit address signals to the rows and columns and to the one or more columns of redundant storage elements, the method comprising the steps of:

generating a selection signal and identifying a defective column within the plurality of columns to be replaced by one of the columns of redundant storage elements in one of the memory arrays;

receiving the selection signal;

simultaneously receiving first data from a first data bus coupled to the rows and columns, and receiving second data from a second data bus coupled to the redundant storage elements; and selecting data either from the first data bus or from the second data bus, as determined by the selection signal.

30. The method of claim 29, further comprising the steps of:

amplifying the first data using a first sense amplifier; and amplifying the second data using a second sense amplifier.

31. The method of claim 29 wherein the method is implemented using a flash EPROM.

32. The method of claim 29 wherein the method is implemented using an SRAM.

33. The method of claim 29 wherein the method is implemented using a DRAM.

34. The method of claim 29 wherein the receiving step comprises the steps of receiving a seven-bit signal from the first data bus and receiving a one-bit signal from the second data bus.

35. The method of claim 29 wherein the method is implemented using a memory having floating gate transistors.

36. The method of claim 29, further comprising the step of receiving third data to be written to the memory.

37. The method of claim 36, further comprising the step of transmitting the third data to either a plurality of first input drivers coupled to the first data bus or to a redundant input driver coupled to the redundant data bus, as determined by the signal.

38. The method of claim 37, further comprising the step of disabling one of the plurality of first input drivers if the one driver is coupled to transmit a bit of the data to a defective column within the columns.

39. The method of claim 29, further comprising the step of receiving an address signal that identifies a defective column within the columns.

40. A memory circuit with parallel processing redundancy, comprising:

a memory having rows and columns, and one or more redundant storage elements, each having addresses associated therewith;

address lines coupled to transmit address signals to the rows and columns and to the one or more redundant storage elements;

a first data bus coupled to the columns;

a redundant data bus coupled to the one or more redundant storage elements;

an access buffer having a first input coupled to the first data bus, a second input coupled to the redundant data bus, a control terminal coupled to receive a signal, and an output, the access buffer selectively coupling the first data bus or the redundant data bus to the output as determined by the signal;

a plurality of first data input drivers coupled between the access buffer and the first data bus, each of the plurality of first data input drivers transmitting at least one bit of data to the first data bus;

a redundant data input driver coupled between the access buffer and the redundant data bus, the access buffer selectively coupling the first data input drivers to the first data bus or the redundant data input driver to the redundant data bus as determined by the signal; and a circuit for disabling one of the plurality of first data input drivers if the one driver is coupled to transmit a bit of the data to a defective column within the columns.

41. A computer, comprising:

a processor;

a clock circuit connected to the processor;

a module, connected to the processor, for interfacing the processor with peripheral devices; and a memory circuit connected to the processor, comprising:

a memory having rows and columns, and one or more redundant storage elements, each having addresses associated therewith;

address lines coupled to transmit address signals to the rows and columns and to the one or more redundant storage elements;

a first data bus coupled to the columns;

a redundant data bus coupled to the one or more redundant storage elements;

an access buffer having a first input coupled to the first data bus, a second input coupled to the redundant data bus, a control terminal coupled to receive a signal, and an output, the access buffer selectively coupling the first data bus or the redundant data bus to the output as determined by the signal;

a plurality of first data input drivers coupled between the access buffer and the first data bus, each of the plurality of first data input drivers transmitting at least one bit of data to the first data bus;

a redundant data input driver coupled between the access buffer and the redundant data bus, the access buffer selectively coupling the first data input drivers to the first data bus or the redundant data input drivers to the redundant data bus as determined by the signal; and a circuit for disabling one of the plurality of first data input drivers if the one driver is coupled to transmit a bit of data to a defective column within the columns.

42. A method of parallel processing redundancy in a memory which includes multiple memory arrays, each memory array having rows and columns of non-redundant storage elements, one or more columns of redundant storage elements, and addresses associated therewith, address lines coupled to transmit address signals to the rows and columns and to the one or more columns of redundant storage elements, the method comprising the steps of:

identifying a defective column within the plurality of columns to be replaced by one of the columns of redundant storage elements of the memory arrays;

receiving the selection signal;

simultaneously receiving first data from a first data bus coupled to the rows and columns, and receiving second data from a second data bus coupled to the redundant storage elements;

selecting data either from the first data bus or from the second data bus, as determined by the selection signal;

transmitting the third data to either a plurality of first input drivers coupled to the first data bus or to a redundant input driver coupled to the redundant data bus, as determined by the signal; and disabling one of the plurality of first input drivers if the one driver is coupled to transmit a bit of the data to a defective column within the columns.

* * * * *